(12) United States Patent
King et al.

(10) Patent No.: US 10,651,800 B2
(45) Date of Patent: May 12, 2020

(54) BOOSTED AMPLIFIER WITH CURRENT LIMITING

(71) Applicant: Cirrus Logic International Semiconductor Ltd., Edinburgh (GB)

(72) Inventors: Eric J. King, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/887,644

(22) Filed: Feb. 2, 2018

(65) Prior Publication Data

US 2018/0234055 A1    Aug. 16, 2018

Related U.S. Application Data

(60) Provisional application No. 62/457,480, filed on Feb. 10, 2017, provisional application No. 62/477,086, filed on Mar. 27, 2017.

(51) Int. Cl.
| | | |
|---|---|---|
| *H03F 1/02* | (2006.01) | |
| *H03F 3/187* | (2006.01) | |
| *H03F 1/52* | (2006.01) | |
| *H03F 3/217* | (2006.01) | |
| *H02M 3/07* | (2006.01) | |

(52) U.S. Cl.
CPC ............ *H03F 1/0227* (2013.01); *H02M 3/07* (2013.01); *H03F 1/025* (2013.01); *H03F 1/523* (2013.01); *H03F 3/187* (2013.01); *H03F 3/2171* (2013.01); *H03F 3/2173* (2013.01); *H03F 2200/03* (2013.01); *H03F 2200/258* (2013.01)

(58) Field of Classification Search
CPC ..................................................... H03F 1/0227
See application file for complete search history.

(56) References Cited

U.S. PATENT DOCUMENTS

| | | |
|---|---|---|
| 5,889,427 A | 3/1999 | Nakajima |
| 5,973,368 A | 10/1999 | Pearce et al. |
| 5,973,944 A | 10/1999 | Nork |

(Continued)

FOREIGN PATENT DOCUMENTS

| | | |
|---|---|---|
| EP | 2688201 A1 | 1/2014 |
| EP | 2897270 A1 | 7/2015 |
| WO | 2008074666 A1 | 6/2008 |

OTHER PUBLICATIONS

International Search Report and Written Opinion of the International Searching Authority, International Application No. PCT/US2018/017317, dated May 15, 2018.

(Continued)

*Primary Examiner* — Patricia T Nguyen
(74) *Attorney, Agent, or Firm* — Jackson Walker L.L.P.

(57) ABSTRACT

A boosted amplifier system may include a boost stage configured to boost an input voltage of the boost stage to an output voltage greater than the input voltage and an amplifier stage powered by the output voltage of the charge pump and configured to amplify an input signal to generate an output signal. The boost stage may have input current limiting circuitry for ensuring that an input current of the boost stage is maintained below a current limit and the amplifier stage may have an input for receiving an indication of whether the current-limiting circuitry of the boost stage is activated to maintain the input current of the boost stage below the current limit.

18 Claims, 2 Drawing Sheets

(56) References Cited

U.S. PATENT DOCUMENTS

| | | | |
|---|---|---|---|
| 6,055,168 A | 4/2000 | Kotowski et al. | |
| 6,185,082 B1* | 2/2001 | Yang | H02M 1/32 |
| | | | 323/285 |
| 6,226,193 B1 | 5/2001 | Bayer et al. | |
| 6,438,005 B1 | 8/2002 | Walter | |
| 6,445,623 B1 | 9/2002 | Zhang et al. | |
| 6,483,282 B1 | 11/2002 | Bayer | |
| 6,504,422 B1 | 1/2003 | Rader et al. | |
| 6,512,411 B2 | 1/2003 | Meng et al. | |
| 6,570,435 B1 | 5/2003 | Hastings | |
| 6,937,487 B1 | 8/2005 | Bron | |
| 6,995,995 B2 | 2/2006 | Zeng et al. | |
| 7,207,054 B1* | 4/2007 | Richards | H03F 1/0227 |
| | | | 323/282 |
| 7,208,997 B2 | 4/2007 | Sohara | |
| 7,256,640 B2 | 8/2007 | Ucciardello et al. | |
| 7,304,871 B2 | 12/2007 | Ito et al. | |
| 7,605,579 B2 | 10/2009 | Betser et al. | |
| 7,990,205 B2 | 8/2011 | Jung | |
| 8,013,664 B2 | 9/2011 | Gerber | |
| 8,193,853 B2 | 6/2012 | Hsieh et al. | |
| 8,264,273 B2 | 9/2012 | MacFarlane | |
| 8,311,243 B2 | 11/2012 | Tucker et al. | |
| 8,610,492 B2 | 12/2013 | Prabhu et al. | |
| 8,729,816 B1 | 5/2014 | Genest | |
| 8,963,535 B1* | 2/2015 | Melanson | G01R 33/07 |
| | | | 307/116 |
| 9,136,755 B2 | 9/2015 | Lesso et al. | |
| 9,172,300 B2 | 10/2015 | Li et al. | |
| 9,209,757 B1 | 12/2015 | Thandri et al. | |
| 9,225,234 B2 | 12/2015 | Ku et al. | |
| 9,264,053 B2 | 2/2016 | Englekirk | |
| 9,484,799 B2 | 11/2016 | Zhang et al. | |
| 9,680,371 B2 | 6/2017 | Saadat et al. | |
| 9,819,260 B2 | 11/2017 | Hissink et al. | |
| 9,847,712 B2 | 12/2017 | Low et al. | |
| 10,114,392 B2 | 10/2018 | King et al. | |
| 10,283,989 B1* | 5/2019 | Hogan | H02J 7/0052 |
| 2003/0085752 A1 | 5/2003 | Rader et al. | |
| 2004/0136212 A1* | 7/2004 | Abe | H02M 3/073 |
| | | | 363/59 |
| 2005/0219878 A1 | 10/2005 | Ito et al. | |
| 2006/0250177 A1 | 11/2006 | Thorp et al. | |
| 2007/0024347 A1 | 2/2007 | Nagasawa et al. | |
| 2007/0146051 A1 | 6/2007 | Tsen | |
| 2007/0211502 A1 | 9/2007 | Komiya | |
| 2007/0279021 A1 | 12/2007 | Yanagida et al. | |
| 2008/0030261 A1 | 2/2008 | Nakata | |
| 2008/0054855 A1* | 3/2008 | Hussain | H02J 7/0057 |
| | | | 320/162 |
| 2009/0108681 A1 | 4/2009 | Litovsky | |
| 2010/0013548 A1 | 1/2010 | Barrow | |
| 2010/0277225 A1 | 11/2010 | Gerber | |
| 2011/0298545 A1 | 12/2011 | Morimoto et al. | |
| 2014/0055197 A1 | 2/2014 | Khlat et al. | |
| 2014/0057684 A1 | 2/2014 | Khlat | |
| 2016/0072485 A1* | 3/2016 | Vice | H03F 1/0255 |
| | | | 330/296 |
| 2017/0359652 A1* | 12/2017 | Serwy | H03F 3/183 |
| 2018/0109181 A1 | 4/2018 | King et al. | |
| 2018/0120884 A1 | 5/2018 | King et al. | |
| 2018/0152101 A1 | 5/2018 | King et al. | |
| 2018/0234063 A1 | 8/2018 | King et al. | |

OTHER PUBLICATIONS

International Search Report and Written Opinion of the International Searching Authority, International Application No. PCT/US2018/017322, dated May 16, 2018.

International Search Report and Written Opinion of the International Searching Authority, International Application No. PCT/US2017/056590, dated Jan. 22, 2018.

International Search Report and Written Opinion of the International Searching Authority, International Application No. PCT/US2017/063429, dated Feb. 16, 2018.

International Search Report and Written Opinion of the International Searching Authority, International Application No. PCT/US2017/059545, dated May 9, 2018.

* cited by examiner

BOOSTED AMPLIFIER WITH CURRENT LIMITING

CROSS-REFERENCES AND RELATED APPLICATION

The present disclosure claims benefit of U.S. Provisional Patent Application Ser. No. 62/457,480, filed Feb. 10, 2017, and U.S. Provisional Patent Application Ser. No. 62/477,086, filed Mar. 27, 2017, which are incorporated by reference herein in their entirety.

FIELD OF DISCLOSURE

The present disclosure relates in general to boosted amplifiers, including without limitation personal audio devices such as wireless telephones and media players, and more specifically, to systems and methods for controlling impedance of an amplifier in order to maintain an input current limit to a boost stage of the boosted amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a variable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

In a typical charge pump power supply, a charge pump may operate in accordance with two non-overlapping clock phases of a switching cycle of the charge pump, with different combinations of connections among an input power source to the charge pump (e.g., a battery), a flying capacitor of the charge pump for storing charge, and an output load capacitor which provides the power supply voltage generated by the charge pump. However, one disadvantage of a charge pump may occur when switching between output voltage modes of the charge pump. In general, the voltage on the flying capacitor of the charge pump may be equal to the voltage of the input power source. If the output voltage is smaller than the sum of the input power source voltage and the flying capacitor voltage during an increase in charge pump ratio, the charge pump may need to source a large inrush current from its power source (e.g., a battery). On the other hand, if the output voltage is greater than the sum of the input power source voltage and the flying capacitor voltage, the charge pump may need to sink large current to its power source. Because of the sizes of capacitors often used in charge pumps, the amount of current that a charge pump may source or sink when switching between modes may not be able to be absorbed by the power source to the charge pump, which may lead to system damage. Accordingly, methods and systems for limiting such switching currents are desirable.

Examples of systems and methods for current limiting in amplifiers with boosted charge pump power supplies, and conditions for initiating such current limiting, are described in U.S. application Ser. No. 15/783,506 filed Oct. 13, 2017, U.S. application Ser. No. 15/800,743 filed Nov. 1, 2017, and U.S. application Ser. No. 15/823,140 filed Nov. 27, 2017, all of which are incorporated by reference herein.

SUMMARY

In accordance with the teachings of the present disclosure, certain disadvantages and problems associated with performance of charge pumps have been reduced or eliminated.

In accordance with embodiments of the present disclosure, a boosted amplifier system may include a boost stage configured to boost an input voltage of the boost stage to an output voltage greater than the input voltage and an amplifier stage powered by the output voltage of the charge pump and configured to amplify an input signal to generate an output signal. The boost stage may have input current limiting circuitry for ensuring that an input current of the boost stage is maintained below a current limit and the amplifier stage may have an input for receiving an indication of whether the current-limiting circuitry of the boost stage is activated to maintain the input current of the boost stage below the current limit.

In accordance with these and other embodiments of the present disclosure, a method may include, in a boosted amplifier system comprising a boost stage configured to boost an input voltage of the boost stage to an output voltage greater than the input voltage and an amplifier stage powered by the output voltage of the charge pump and configured to amplify an input signal to generate an output signal, maintaining an input current of the boost stage below a current limit responsive to a condition for current limiting in the boost stage and receiving at the amplifier stage an indication of whether the current-limiting circuitry of the boost stage is activated to maintain the input current of the boost stage below the current limit.

In accordance with these and other embodiments of the present disclosure, a controller for controlling operation of a boosted amplifier system comprising a boost stage configured to boost an input voltage of the boost stage to an output voltage greater than the input voltage and an amplifier stage powered by the output voltage of the charge pump and configured to amplify an input signal to generate an output signal may be provided. The controller may include an input for receiving a signal indicative of whether a condition exists for current limiting in a boost stage and, responsive to the signal indicating that the condition exists for current limiting in a boost stage, cause the boost stage to maintain an input current of the boost stage below a current limit responsive to a condition for current limiting in the boost stage and communicate to the amplifier stage an indication of whether the current-limiting circuitry of the boost stage is activated to maintain the input current of the boost stage below the current limit.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
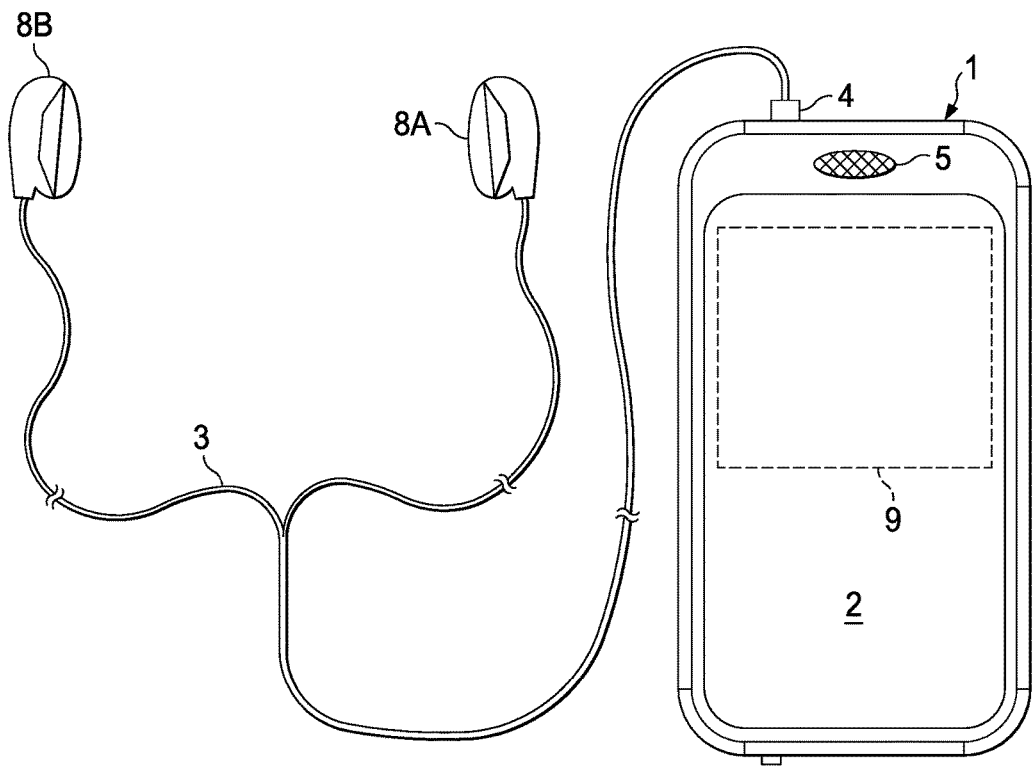
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
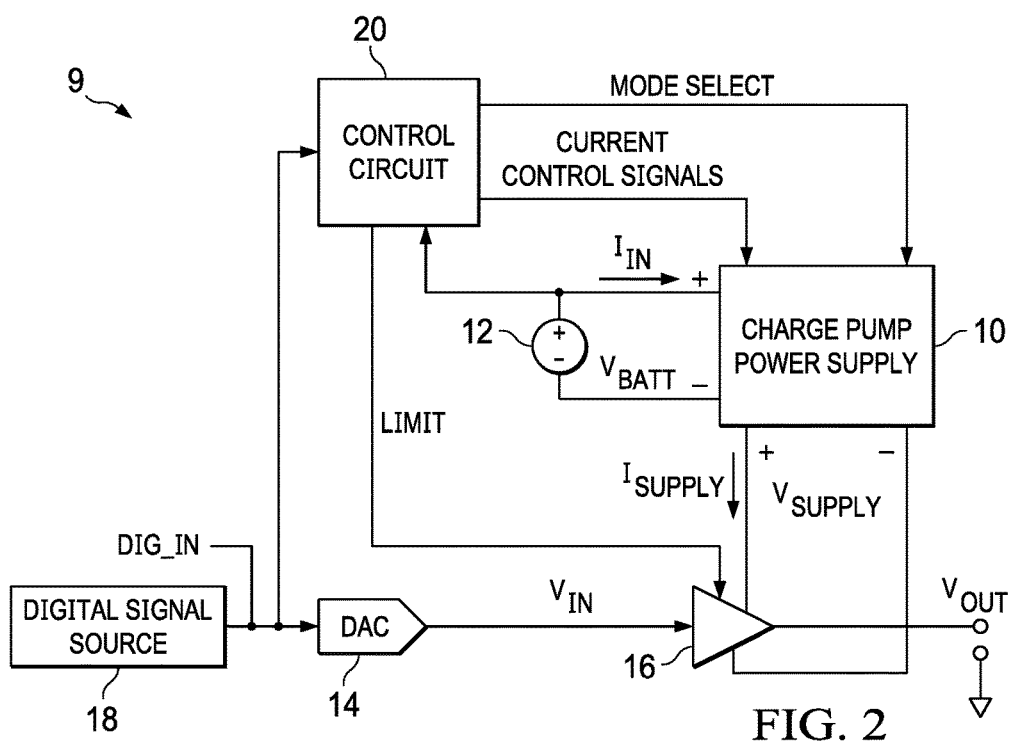
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source 18 (e.g., a processor, digital signal processor, microcontroller, test equipment, or other suitable digital signal source) may supply a digital input signal DIG_IN to a digital-to-analog converter (DAC) 14, which may in turn convert digital input signal DIG_IN into an equivalent analog input signal $V_{IN}$ and communicate analog input signal $V_{IN}$ to a power amplifier stage 16 which may amplify or attenuate the analog input signal $V_{IN}$ and provide an output signal $V_{OUT}$, which, in embodiments in which digital input signal DIG_IN, analog input signal $V_{IN}$, and output signal $V_{OUT}$ are audio signals, may operate a speaker, headphone transducer, and/or a line level signal output. However, application of IC 9 as depicted in FIG. 2 may not be limited to audio applications. In addition, although power amplifier stage 16 is depicted as a single-ended output generating a single-ended audio output signal $V_{OUT}$, in some embodiments, power amplifier stage 16 may comprise a differential output, and may thus provide a differential audio output signal $V_{OUT}$.

Figure 4:
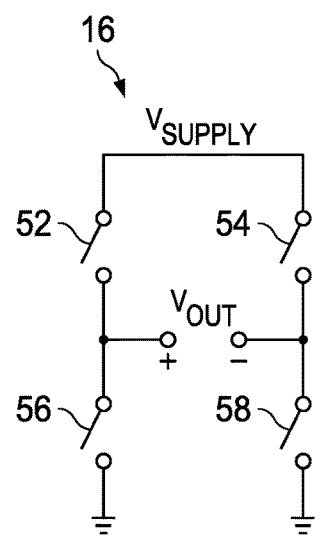
FIG. 4 is a block diagram of selected components of an example power amplifier, in accordance with embodiments of the present disclosure.

In some embodiments, DAC 14 may include a modulator configured to generate analog input signal $V_{IN}$ as a pulse-modulated signal (e.g., a pulse-width modulated signal or a pulse-density modulated signal), in which case power amplifier stage 16 may be implemented as a Class-D amplifier (e.g., as shown in FIG. 4, discussed in greater detail below).

A charge pump power supply 10 may provide the power supply rail inputs of a supply voltage $V_{SUPPLY}$ to power amplifier stage 16 and may receive a power source input, generally from a battery 12 or other power supply, which may provide an input voltage $V_{BATT}$ to charge pump power supply 10. A control circuit 20 may supply a mode select signal to charge pump power supply 10 that selects an operating mode of charge pump power supply 10 so as to adjust supply voltage $V_{SUPPLY}$ generated by charge pump power supply 10 according to expected and/or actual signal levels at the output of power amplifier stage 16. When low signal levels exist and/or are expected at amplifier output $V_{OUT}$, mode control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time control circuit 20 may select an operating mode from a plurality of operating modes in each operating mode operating charge pump power supply 10 at a different supply voltage, $V_{SUPPLY}$, wherein the supply voltage $V_{SUPPLY}$ in one operational mode is a rational multiple or ratio of supply voltages of other operational modes.

Also as shown in FIG. 2, power amplifier stage 16 may be configured to receive current limit indicator signal LIMIT from control circuit 20. As also described in greater detail below, responsive to current limit indicator signal LIMIT indicating that control circuit 20 has applied current limits to charge pump power supply 10, an output impedance of power amplifier stage 16 may be controlled as a reactive protection when control circuit 20 has applied current limits.

Figure 3:
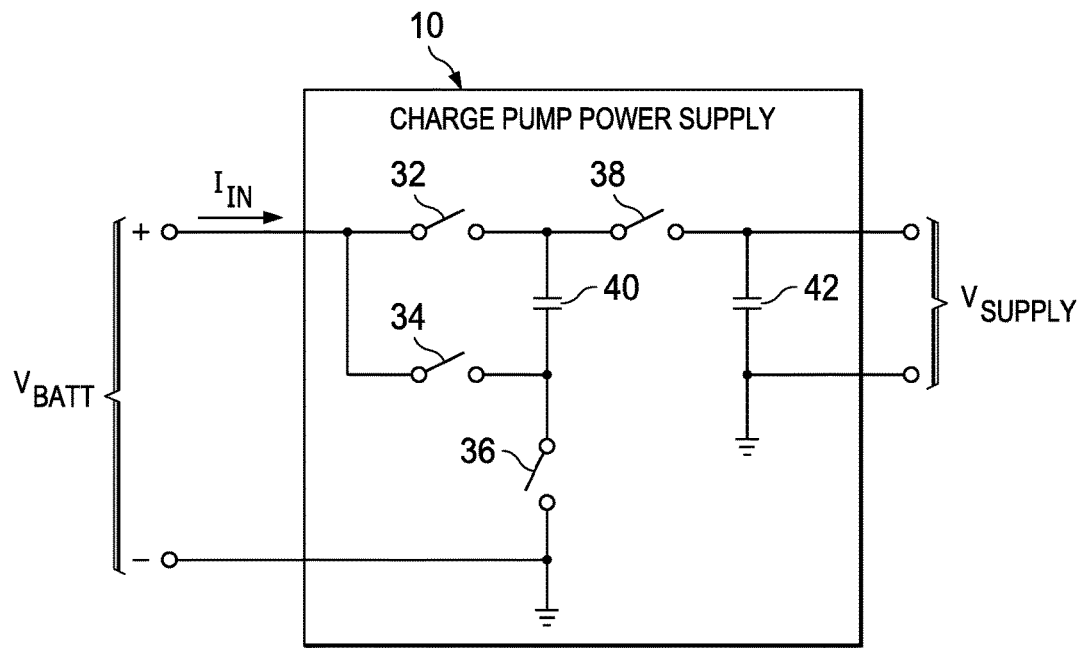
FIG. 3 is a block diagram of selected components of an example charge pump power supply, in accordance with embodiments of the present disclosure.

FIG. 3 is a block diagram of selected components of an example charge pump power supply 10, in accordance with embodiments of the present disclosure. Charge pump power supply 10 as shown in FIG. 3 may be configured to operate in two modes: a first mode in which the supply voltage $V_{SUPPLY}$ output by charge pump power supply 10 is equal to input voltage $V_{BATT}$, and a second mode in which the supply voltage $V_{SUPPLY}$ output by charge pump power supply 10 is equal to two times input voltage $V_{BATT}$. As shown in FIG. 3, charge pump power supply 10 may include switches 32, 34, 36, and 38, a flying capacitor 40, and a charge pump output capacitor 42.

Each switch 32, 34, 36, and 38 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 32, 34, 36, and 38 are not depicted, although such control signals would be present to selectively enable and disable switches 32, 34, 36, and 38. In some embodiments, a switch 32, 34, 36, and 38 may comprise an n-type metal-oxide-semiconductor field-effect transistor. In these and other embodiments, a switch 32, 34, 36, and 38 may comprise a p-type metal-oxide-semiconductor field-effect transistor. Switch 32 may be coupled between a positive input terminal of charge pump power supply 10 and a first terminal of flying capacitor 40. Switch 34 may be coupled between the positive input terminal of charge pump power supply 10 and a second terminal of flying capacitor 40. Switch 36 may be coupled between a negative input terminal of charge pump power supply 10 and a second terminal of flying capacitor 40. Switch 38 may be coupled between the first terminal of flying capacitor 40 and a first terminal of charge pump output capacitor 42.

Flying capacitor 40 and charge pump output capacitor 42 may each comprise a passive two-terminal electrical component used to store energy electrostatically in an electric field, which may generate a current in response to a time-varying voltage across the capacitor (or vice versa). Charge pump output capacitor 42 may be coupled between the output terminals of charge pump power supply 10, and thus may store supply voltage $V_{SUPPLY}$ output by charge pump power supply 10.

In the first mode, charge pump power supply 10 may operate in a single phase, wherein switch 34 may be disabled and switches 32, 36, and 38 may be enabled during operation, thus charging voltage $V_{SUPPLY}$ on charge pump output capacitor 42 to input voltage $V_{BATT}$. In the second mode, charge pump power supply 10 may sequentially operate in a charging phase in which switches 32 and 36 are enabled and switches 34 and 38 are disabled, allowing charge transfer from battery 12 to flying capacitor 40, and a transfer phase in which switches 32 and 36 are disabled and switches 34 and 38 are enabled, boosting the voltage on flying capacitor 40 and allowing charge transfer from flying capacitor 40 to charge pump output capacitor 42.

Although FIG. 3 depicts a particular implementation of a charge pump power supply 10 configured to switch between a first mode in which the boost ratio of supply voltage $V_{SUPPLY}$ and input voltage $V_{BATT}$ is 1, and a second mode in which the boost ratio of supply voltage $V_{SUPPLY}$ and input voltage $V_{BATT}$ is 2, the systems and methods herein may generally apply to charge pump power supplies having more than two modes of operation and/or boost ratios other than 1 or 2 (e.g., 1.5, 3, etc.). In addition, although FIG. 3 depicts a particular implementation of a charge pump power supply 10 having switches 32-38, a single flying capacitor 40, and a charge pump output capacitor 42, the systems and methods herein may generally apply to charge pump power supplies having any suitable topology of switches, one or more flyback capacitors, and one or more load capacitors.

As shown in FIGS. 2 and 3, battery 12 may supply a current $I_{IN}$ to charge pump power supply 10, and charge pump power supply 10 may generate a current $I_{SUPPLY}$ to power amplifier stage 16. As mentioned in the Background section of this application, it may be advantageous to limit the current $I_{IN}$ sourced from or sunk to battery 12 by charge pump power supply 10. Thus, in accordance with methods and systems of the present disclosure, control circuit 20 may also be configured to generate control signals as shown in FIG. 2 to limit input current $I_{IN}$. Examples of such current limiting are set forth in U.S. application Ser. No. 15/783,506 filed Oct. 13, 2017, U.S. application Ser. No. 15/800,743 filed Nov. 1, 2017, and U.S. application Ser. No. 15/823,140 filed Nov. 27, 2017, all of which are incorporated by reference herein. In addition, control circuit 20 may also be configured to generate control signals as shown in FIG. 2 to throttle output power, as described in greater detail below.

Thus, in operation, control circuit 20 may control an output power of charge pump power supply 10 by controlling an output voltage generated by the charge pump. In some embodiments, control circuit 20 may limit the output power by controlling supply voltage $V_{SUPPLY}$ generated by charge pump power supply 10 based on a measurement of one or more variables (e.g., input voltage $V_{BATT}$, supply voltage $V_{SUPPLY}$, and/or a multiplication ratio) associated with charge pump power supply 10.

Charge pump power supply 10 and power amplifier stage 16 may together form a boosted amplifier having a first stage or boost stage comprising charge pump power supply 10 and a second stage or amplifier stage comprising power amplifier stage 16. While the foregoing contemplates that the first stage/boost stage is implemented using charge pump power supply 10, it is understood that a first stage/boost stage may be implemented using any suitable circuit capable of boosting voltage $V_{BATT}$ to a higher voltage $V_{SUPPLY}$. For example, in some embodiments, an inductor-based boost power converter may be used in lieu of charge pump power supply 10 depicted in FIGS. 2 and 3.

FIG. 4 is a block diagram of selected components of an example power amplifier stage 16, in accordance with embodiments of the present disclosure. In some embodiments, example power amplifier stage 16 of FIG. 4 may be used to implement power amplifier stage 16 of FIG. 2. As shown in FIG. 4, power amplifier stage 16 may include a Class-D amplifier having an output bridge of switches 52, 54, 56, and 58 which are driven by analog input signal $V_{IN}$ (or a derivative thereof). For example, when analog input signal $V_{IN}$ is a pulse-modulated signal, analog driving signal DRIVE may drive switches 52 and 58 while an inverse of analog input signal $V_{IN}$ may drive switches 54 and 56. As shown in FIG. 2 and described above, power amplifier stage 16 may be configured to receive current limit indicator signal LIMIT from control circuit 20, and, responsive to current limit indicator signal LIMIT indicating that control circuit 20 has applied current limits to charge pump power supply 10, an output impedance of power amplifier stage 16 may be controlled as a reactive protection when control circuit 20 has applied current limits. For example, in some embodiments, responsive to current limit indicator signal LIMIT indicating that control circuit 20 has applied current limits to charge pump power supply 10, power amplifier stage 16 maybe be set to a high-impedance state. In some embodiments, such high-impedance state may be achieved by forcing switches 52 and 54 to be disabled (e.g., off, open, deactivated) when current limit indicator signal LIMIT indicates that control circuit 20 has applied current limits. In other embodiments, such high-impedance state may be achieved by forcing switches 52, 54, 56, and 58 to be disabled (e.g., off, open, deactivated) when current limit indicator signal LIMIT indicates that control circuit 20 has applied current limits.

Switches 52, 54, 56, and 58 may be implemented in any suitable manner. For example, in some embodiments, each switch 52, 54, 56, and 58 may be implemented using an n-type metal-oxide-semiconductor field-effect transistor.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A boosted amplifier system comprising:
   a boost stage configured to boost an input voltage of the boost stage to an output voltage greater than the input voltage; and
   an amplifier stage powered by the output voltage of a charge pump and configured to amplify an input signal to generate an output signal;
   wherein:
      the boost stage has input current-limiting circuitry for ensuring that an input current of the boost stage is maintained below a current limit; and
      the amplifier stage has an input for receiving an indication of whether the current-limiting circuitry of the boost stage is activated to maintain the input current of the boost stage below the current limit.

2. The boosted amplifier system of claim 1, wherein the amplifier stage comprises an amplifier configured to amplify the input signal in the form of a pulse-modulated signal to generate the output signal.

3. The boosted amplifier system of claim 2, wherein the amplifier stage is configured to modify its behavior when the indication indicates that the current-limiting circuitry of the boost stage is activated to maintain the input current of the boost stage below the current limit.

4. The boosted amplifier system of claim 3, wherein:
   the amplifier stage comprises an output bridge circuit comprising a plurality of switches; and
   modifying the behavior of the amplifier stage comprises deactivating high-side switches of the output bridge circuit, wherein each high-side switch comprises a switch coupled between the output voltage of the boost stage and an output terminal of the amplifier stage.

5. The boosted amplifier system of claim 4, wherein modifying the behavior of the amplifier stage further comprises deactivating low-side switches of the output bridge circuit, wherein each low-side switch comprises a switch coupled between a ground voltage and an output terminal of the amplifier stage.

6. The boosted amplifier system of claim 1, wherein the boost stage comprises a charge pump power supply.

7. A method comprising, in a boosted amplifier system comprising a boost stage configured to boost an input voltage of the boost stage to an output voltage greater than the input voltage and an amplifier stage powered by the output voltage of a charge pump and configured to amplify an input signal to generate an output signal:
   maintaining an input current of the boost stage below a current limit responsive to a condition for current limiting in the boost stage; and
   receiving at the amplifier stage an indication of whether current-limiting circuitry of the boost stage is activated to maintain the input current of the boost stage below the current limit.

8. The method of claim 7, wherein the amplifier stage comprises an amplifier configured to amplify the input signal in the form of a pulse-modulated signal to generate the output signal.

9. The method of claim 8, further comprising modifying the behavior of the amplifier stage when the indication indicates that the current-limiting circuitry of the boost stage is activated to maintain the input current of the boost stage below the current limit.

10. The method of claim 9, wherein:
    the amplifier stage comprises an output bridge circuit comprising a plurality of switches; and
    modifying the behavior of the amplifier stage comprises deactivating high-side switches of the output bridge circuit, wherein each high-side switch comprises a switch coupled between the output voltage of the boost stage and an output terminal of the amplifier stage.

11. The method of claim 10, wherein modifying the behavior of the amplifier stage further comprises deactivating low-side switches of the output bridge circuit, wherein each low-side switch comprises a switch coupled between a ground voltage and an output terminal of the amplifier stage.

12. The method of claim 7, wherein the boost stage comprises a charge pump power supply.

13. A controller for controlling operation of a boosted amplifier system comprising a boost stage configured to boost an input voltage of the boost stage to an output voltage greater than the input voltage and an amplifier stage powered by the output voltage of a charge pump and configured to amplify an input signal to generate an output signal, the controller comprising:
   an input for receiving a signal indicative of whether a condition exists for current limiting in a boost stage; and responsive to the signal indicating that the condition exists for current limiting in a boost stage:
    causing the boost stage to maintain an input current of the boost stage below a current limit responsive to a condition for current limiting in the boost stage; and
    communicating to the amplifier stage an indication of whether current-limiting circuitry of the boost stage is activated to maintain the input current of the boost stage below the current limit.

14. The controller of claim 13, wherein the amplifier stage comprises an amplifier configured to amplify the input signal in the form of a pulse-modulated signal to generate the output signal.

15. The controller of claim 14, further comprising causing the amplifier stage to modify its behavior when the indication indicates that the current-limiting circuitry of the boost stage is activated to maintain the input current of the boost stage below the current limit.

16. The controller of claim 15, wherein:
    the amplifier stage comprises an output bridge circuit comprising a plurality of switches; and
    modifying the behavior of the amplifier stage comprises deactivating high-side switches of the output bridge circuit, wherein each high-side switch comprises a switch coupled between the output voltage of the boost stage and an output terminal of the amplifier stage.

17. The controller of claim 16, wherein modifying the behavior of the amplifier stage further comprises deactivating low-side switches of the output bridge circuit, wherein each low-side switch comprises a switch coupled between a ground voltage and an output terminal of the amplifier stage.

18. The controller of claim 13, wherein the boost stage comprises a charge pump power supply.

* * * * *

UNITED STATES PATENT AND TRADEMARK OFFICE
CERTIFICATE OF CORRECTION

PATENT NO. : 10,651,800 B2  
APPLICATION NO. : 15/887644  
DATED : May 12, 2020  
INVENTOR(S) : King et al.

Page 1 of 1

It is certified that error appears in the above-identified patent and that said Letters Patent is hereby corrected as shown below:

In the Claims

1. In Column 8, Line 66, in Claim 13, delete "a boost stage;" and insert -- the boost stage; --, therefor.

2. In Column 9, Line 2, in Claim 13, delete "a boost stage:" and insert -- the boost stage: --, therefor.

Signed and Sealed this  
Twenty-seventh Day of September, 2022

Katherine Kelly Vidal  
*Director of the United States Patent and Trademark Office*